United States Patent [19]

Shiomi et al.

[11] Patent Number: 4,667,168
[45] Date of Patent: May 19, 1987

[54] INTEGRATED CIRCUIT WITH A PHASE-LOCKED LOOP

[75] Inventors: Makoto Shiomi, Katsuta; Kuniaki Miura, Ibaraki; Isao Fukushima, Katsuta; Eiji Moro, Katsuta; Shigeaki Kanenari, Katsuta, all of Japan

[73] Assignees: Hitachi Video Engineering Co., Ltd., Kanagawa; Hitachi, Ltd., Tokyo, both of Japan

[21] Appl. No.: 839,535

[22] Filed: Mar. 14, 1986

[30] Foreign Application Priority Data

Mar. 20, 1985 [JP] Japan .................................. 60-54636

[51] Int. Cl.$^4$ ........................... H03L 7/06; H03L 7/00
[52] U.S. Cl. ........................................ 331/1 R; 331/2; 331/8; 331/25; 331/36 C
[58] Field of Search ................... 331/2, 8, 17, 25, 1 R, 331/36 C, 108 C; 360/37.1, 51; 369/1

[56] References Cited

U.S. PATENT DOCUMENTS

3,994,019 11/1976 Sagishima et al. ................. 369/1 X
4,135,164 1/1979 Kurata ............................. 331/36 C Primary Examiner—Eugene R. LaRoche
Assistant Examiner—David Mis
Attorney, Agent, or Firm—Antonelli, Terry & Wands

[57] ABSTRACT

The IC chip consists of electronic circuits wherein voltage control oscillator whose oscillation frequency is dependent on the product of the resistance value of a resistor element and the electrostatic capacity of a capacitor element is provided; said capacitor element consists of the first variable capacitor; said voltage control oscillator comprises said capacitor consisting of said first variable capacitor; said first variable capacitor is controlled by the output obtained by detecting the output signal of said voltage control oscillator by its phase, using the predetermined reference signal, whereby the oscillation frequency of said voltage control oscillator can be made to agree with the frequency of said reference signal. Furthermore, the characteristic of said electronic circuit is dependent on a second resistor element and a second variable capacitor element; said second variable capacitor is controlled by the output obtained by the phase detection so that dispersions of the resistance value of the resistor element and the electrostatic capacity of the capacitor element in said electronic circuit are absorbed automatically.

4 Claims, 13 Drawing Figures

INTEGRATED CIRCUIT WITH A PHASE-LOCKED LOOP

BACKGROUND OF THE INVENTION

The present invention relates to an integrated circuit consisting of one or a plural number of electronic circuits integrated in one chip whose characteristics are dependent on the product of the value of a resistance and an electrostatic capacity of a capacitor.

Recently, as one of the means of promoting further compactness, reduction of weight and reduction of production cost of electronic equipment, the integration of the electronic circuits (IC) has been promoted. Nevertheless, there is an increasing demand for the further compactness of the integrated circuit through the integration of functionally different plural numbers of electronic circuits on a common substrate (IC chip).

The conventional electronic circuit, in many instances, consists of such parts as the filters, oscillators and pulse delay circuits which are formed with inductance, capacitance and resistance elements, respectively. The major drawbacks to obtaining further compactness, reduction of the weight and reduction of the production cost of the electronic circuit have been the difficulty of incorporating the inductor into the IC, relatively large dispersion of the values (the resistance and the electrostatic capacity) of resisters and capacitors incorporated into the IC due to the effect of the changes in the environmental condition such as the temperature, the need of using many external parts in incorporating the oscillator and the electronic circuit such as the pulse delay circuit into the IC and the need of the separate adjustments of the individual circuits.

For example, in the case of the portable VTR which attaches importance to maneuverability, the compactness and the reduction of the weight of the electronic circuit section through using the IC is one of the important requirements to be met. On the other hand, in the case of the desk-top type VTR, the reduction of the manufacturing cost is largely affected by the reduction in the number of the elements contained in an IC and the reduction of the number of the parts which require the adjustment. Meeting these requirements for the VTR are also restricted by the aforementioned reasons.

Figure 1:
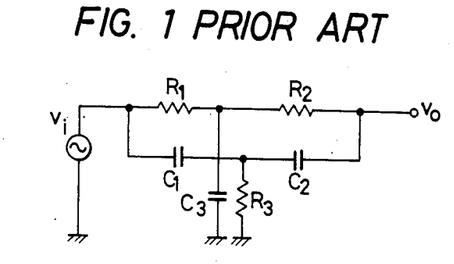
FIG. 1 is a circuit diagram showing the twin-T type trap filter.

As an example of the means of reducing the number of the external parts, there is the incorporation of the filter into the IC. In this case, the use of the active filter consisting of a capacitor and a resistor can be considered instead of the inductor which is hard to be incorporated into the IC. For example, the twin-T circuit shown in FIG. 1 is generally known as the trap filter. In the case shown in FIG. 1, when the values of the resistor and the capacitors have the following value respectively, $$R_1 = R_2 = 2R_3 = Ra$$

$$C_1 = C_2 = C_3/2 = Ca$$

the trap frequency fr can be expressed as follows:

$$fr = 1/2\pi CaRa$$

However, in FIG. 1, $v_i$ represents the input signal, and $v_o$ the output signal.

When the trap filter of said composition is incorporated into the IC, the dispersion of the characteristics becomes a problem, because the values of the resistors and the capacitors constituting the IC show dispersions due to the errors of the concentrations of the impurities of the semiconductors constituting the IC chip. For instance, the value of the resistors and the capacitors have such large dispersions as follows:

absolute value of resistor R±10%
absolute value of capacitor C±10~15%

Figure 2:
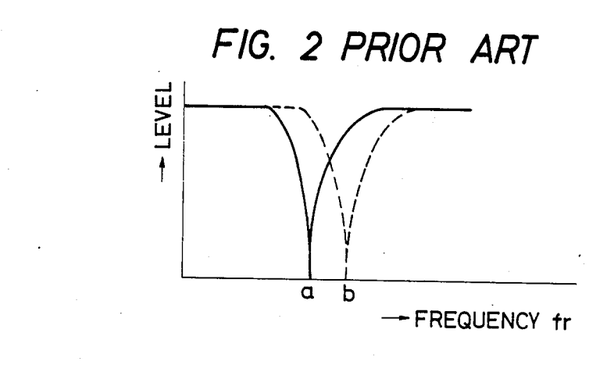
FIG. 2 is a characteristic diagram explaining the dispersion of the trap dispersion.

Thus, the trap frequency fr of the trap filter shown in FIG. 2 varies within the range of a indicated with the solid line and b indicated with the broken line, and even to the extent of ±20 to 25% in the worst case. Such dispersion has been the major drawback to the practical use of the trap filter.

As a countermeasure against this problem, a method for absorbing the dispersion by adjusting the value of the resistance by means of laser trimming on the IC chip has been disclosed in the Japanese Patent Publication No. 58083/1982, and this method has already been put to practical use. However, this method still has problems to be solved such as those concerning the accuracy and the yield rate.

Furthermore, the Japanese Patent Publication No. 36813/1977 and the U.S. Pat. No. 3,761,741 have proposed the variable attenuation circuit utilizing the fact that the resistance of the emitter of the transistor can be varied by the direct current. Also, it is known that the variation of the characteristic of the filter due to the dispersion of the absolute value of the element in the IC chip can be adjusted by a method similar to the above-mentioned method. It should be noted, however, that said technique is not always applicable to all kinds of the filter. For example, this technique is hard to apply to a trap filter consisting of the resistors $R_1$, $R_2$ and $R_3$ as is shown in FIG. 1. Thus, in the case of such filter, the dispersion of the values of the elements in the IC chip has to be absorbed through adjustment from outside, and this gives rise to problems such as the increase in the production cost.

The incorporation of an oscillator into the IC is relatively advanced, but the oscillator in this form still requires the adjustment, and this causes some problems concerning its reliability and production cost.

Figure 3:
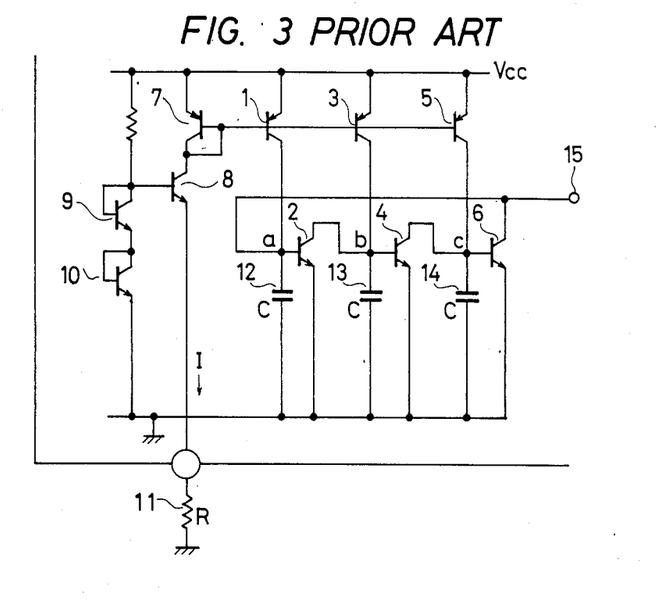
FIG. 3 is the circuit diagram of the ring-oscillator type oscillator.

These problems will be discussed taking the example of the ring oscillator shown in FIG. 3. In this case, the transistors 1 and 2, the transistors 3 and 4 and the transistors 5 and 6 constitute inverters, respectively. On the other hand, the transistors 1, 3 and 5 respectively constitute a current mirror together with the transistor 7. Thus, the collector currents of the transistors 1, 3 and 5 are respectively equal to the collector current of the transistor 7. Furthermore, the voltage between the base and the emitter of the transistor 8 is equal to those of the transistors 9 and 10. When this voltage is given as $V_{BE}$, the base potential of the base of the transistor 8 is $2V_{BE}$, so that the emitter potential of the same is $V_{BE}$. This emitter voltage $V_{BE}$ is applied to the external resistor 11 of the IC. When the resistance of said external resistor 11 is given as R, the current I shown in FIG. 3 can be expressed as $$I = V_{BE}/R \tag{1}$$

The capacitors 12, 13 and 14 are respectively charged by the collector current I of the transistors 1, 3 and 5, and said capacitors and discharged when the transistors 6, 2 and 4 are set to ON. The charging and the discharging of these capacitors 12, 13 and 14 cause the ON and OFF of the transistors 2, 4 and 6, and this causes the pulse to be transmitted to the points a, b and c. The transmission of the pulse to these points, however, is delayed by a certain period of time by the capacitors 12, 13 and 14. The inverter has an odd number of stages, so that when the pulse has made a round from the point a to the point a by way of the points b and c, the positive feedback will be made due to the delay of the time in the inverter, whereby the oscillation occurs, and a series of the pulse will be obtained at the output terminal 15.

The action of said oscillator will be explained in further detail using the signal wave forms (a), (b) and (c) shown in FIG. 4 at the points a, b and c respectively shown in FIG. 3.

When the capacitor 12 is being charged by the collector current I of the transistor 1 while the transistor 2 is OFF, the capacitor 13 is kept fully charged while the transistor 4 is ON, and thus the capacitor 14 is kept charged while the transistor 6 is OFF. When the capacitor 12 is fully charged, the transistor 2 will turned on, and the capacitor 13 will be discharged through the transistor 2, whereby the transistor 4 is turned off, and the charging will be started by the collector current I of the transistor 5.

When the transistor 6 is turned on following the full charge of the capacitor 14, the capacitor 12 will be discharged by way of the transistor 6. Then, the transistor 2 will be off, and the capacitor 13 will start to be charged by the collector current I of the transistor 3.

In this way, the transistors 2, 6, 4 and 2 will be turned on repeatedly in this order, and the periodical change of the level of the point a can be obtained as a series of pulses at the output terminal 15.

The potential between the base and the emitter of the transistors 2, 4 and 6 is also $V_{BE}$, and when the electrostatic capacities of the capacitors 12, 13 and 14 are set equal to each other, the times required until the transistors 2, 4 and 6 are turned on from the start of the charging of the capacitors 12, 13 and 14 are equal to each other, and also equal to the time required for the charging of the capacitors 12, 13 and 14 before the potentials of the bases of the transistors 2, 4 and 6 (the potentials at the points a, b and c) reach $V_{BE}$ from zero. Thus, when the electrostatic capacities of the capacitors 12, 13 and 14 are given as C, the time $t_0$ required for the charging of these capacitors can be expressed as follows:

$$t_0 = C \cdot V_{BE}/I \quad (2)$$

Thus, the oscillation frequency $T_0$ of this oscillator can be given as $$T_0 = 3t_0 \quad (3)$$

Therefore, from the above Eqs. (1) through (3), the oscillation frequency $f_0$ can be expressed as follows:

$$f_0 = 1/T_0 = 1/3CR \quad (4)$$

As stated previously, the absolute value of the capacitor in the IC chip disperses as much as ±10 to 15%. As a result, the oscillation frequency $f_0$ also disperses largely, but this dispersion is absorbed by adjusting the resistance R of the external resistor 11.

As explained in the foregoing, even when it has become possible to incorporate the filter or the oscillator into the IC, the adjustment for absorbing the resistance in the IC chip and the dispersion of the value of the capacitor will be required. Thus, in the case of the conventional integrated circuit, the means of the adjustment is indispensable. The manufacturing method relying on such adjustment, however, is not only time-consuming but also has problems to be solved as to the accuracy of the adjustment and the yield rate.

SUMMARY OF THE INVENTION

The objective of the present invention is to provide an integrated circuit wherein the defects deriving from the conventional manufacturing method are eliminated; the electronic circuit whose electric characteristic is dependent on the product of the value of the resistance of the resistor and the electrostatic capacity of the capacitor incorporated into the IC is provided; the operating frequency deviated due to the dispersions of values of said resistor and said capacity is compared with the reference frequency; said capacitor is replaced with the variable capacitor so that said deviation can be corrected by adjusting the variable capacitor whereby the dispersions of said resistor and capacitor can be absorbed automatically, or providing the integrated circuit capable of maintaining the desired characteristic of the electronic circuit without requiring aforementioned adjustment.

Another objective of the present invention is to provide the integrated circuit which is so designed that the voltage control oscillator consisting of a resistor and a variable capacitor whose frequency is dependent on the product of the resistance of said resistor and the electrostatic capacity of said variable capacitor is provided in the IC chip containing said electronic circuit; the output signal of said voltage control oscillator is detected by the phase using the predetermined reference signal; the detected output is used to control said variable capacitor to make the oscillation frequency of said voltage control oscillator to coincide with the frequency of said reference signal, whereby the dispersion of the characteristic of said electronic circuit can be absorbed.

DESCRIPTION OF THE PREFERRED EMBODIMENTS

The preferred embodiments of the present invention will be explained in reference with the related drawings.

Figure 5:
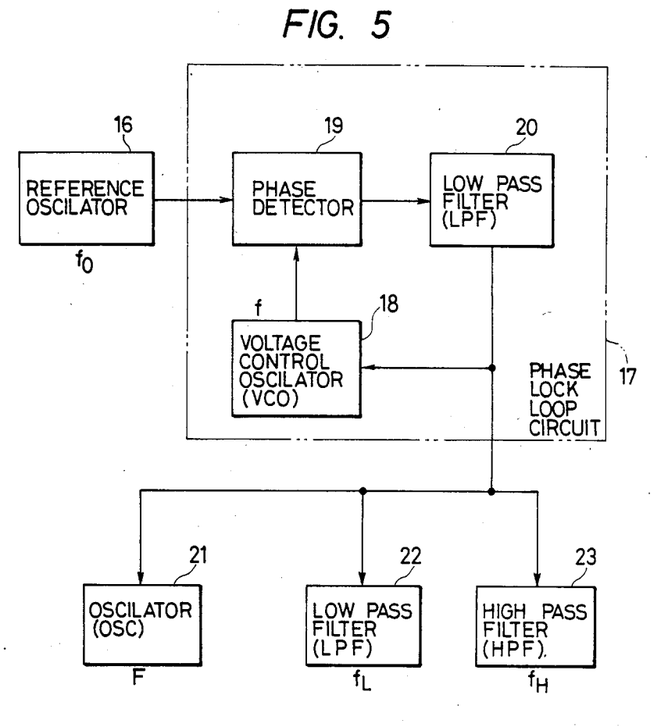
FIG. 5 is a block diagram showing one of the preferred embodiments of the present invention relating to the integrated circuit.

FIG. 5 is a block diagram showing the integrated circuit as an embodiment of the present invention wherein 16 denotes the reference oscillator, 17 the phase lock loop circuit, 18 the voltage control oscillator, 19 the phase detector, 20 the low-pass filter, 21 the oscillator, 22 the low-pass filter, 23 the high-pass filter.

This embodiment relates to an electronic circuit whose characteristic is dependent on the product of the resistance of the resistor and the electrostatic capacity of the capacitors of the electronic circuits comprising the oscillator 21, the low-pass filter 22 and the high-pass filter 23, as said embodiment.

The above-mentioned electronic circuits are incorporated into the IC chip which is not shown in the drawing. The phase lock loop circuit is also incorporated into the IC. This phase lock loop circuit 17, for example, consists of the voltage control oscillator 18, the phase detector 19 and the low-pass filter 20. In the case of said embodiment, voltage control oscillator 18, oscillator 21, low-pass filter 22 and high-pass filter 23 are so designed and arranged that the oscillation of frequencies of said voltage control oscillator 18 and said oscillator 21 and the cut-off frequencies of said low-pass filter 22 and said high-pass filter 23 are respectively dependent on the product of the resistance of the resistors and the electrostatic capacity of the capacitor. In other words, where f: Oscillation frequency of voltage control oscillator 18

F: Oscillation frequency of oscillator 21

$f_L$: Cut-off frequency of low-pass filter 22

$f_H$: Cut-off frequency of high-pass filter 23

R: Resistance of reference resistor

C: Electrostatic capacity of reference capacitor, we obtain $$f = K_1/CR$$

$$F = K_2/CR \quad (5)$$

$$f_L = K_3/CR$$

$$f_H = K_4/CR$$

In the above equations, $K_1$ through $K_4$ represent the constants in the case where the current I is fixed as is explained later by FIG. 7.

Furthermore, this embodiment of the present invention features using the variable capacitor whose electrostatic capacity varies depending on the voltage for each of voltage control oscillator 18, oscillator 21, low-pass filter 22 and high-pass filter 23.

In the case of said variable capacitor, the junction capacity between the base and the emitter of the transistor incorporated into the IC can be used. Said junction capacity Cj can be expressed as $$Cj = \frac{Cj(0)}{\left(1 + \frac{Vj}{\phi}\right)\alpha} \quad (6)$$

$$= Cj(0) \cdot \phi\alpha \cdot \frac{1}{(\phi + Vj)\alpha}$$

Therefore, $$\log Cj = K - \alpha \log (\phi + Vj) \quad (7)$$

where

Cj(0): Junction capacity between base and emitter where bias voltage is 0 (V).

Vj: Voltage between base and emitter (Inverse bias voltage of diode).

$\phi$: Built-in voltage.

$\alpha$: Voltage coefficient.

$K = \log [Cj(0)\cdot\phi^\alpha]$

Figure 6:
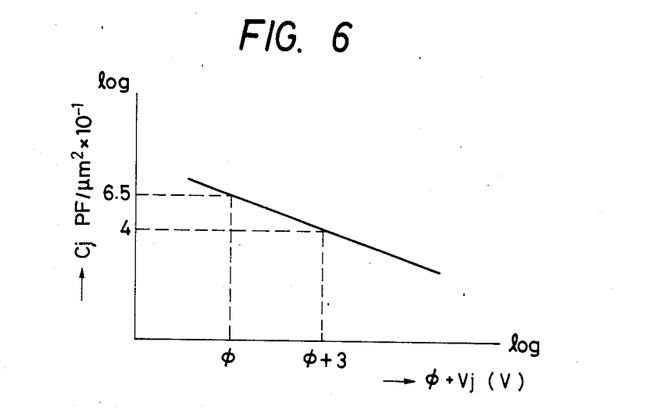
FIG. 6 is a characteristic diagram showing the variation of the electrostatic capacity compared with the applied voltage of the junction capacity between the base and the emitter of the transistor as an example of the variable capacitor.

As is clear from the Eq. (7), the junction capacity Cj varies depending on the voltage Vj between the base and the emitter. An example of this is shown in FIG. 6. When the power source voltage is 5 (V), Vj can be varied within the range of 0 to 3 (V), while Cj can be varied more than ±20 to 25% around its central value (typ).

The performance of this embodiment will be explained by FIG. 5. As stated previously, the dispersion of the value of the resistance of the electronic circuit and the dispersion of the value of the capacitor should be adjusted by equalizing the fixed frequency $f_0$ of the signal to be output from the reference oscillator 16 and the frequency f of the voltage control oscillator 18 or by making $f = f_0$. For this reason, in the case of this embodiment, the reference signal of frequency $f_0$ from said reference oscillator 16 and the signal of frequency f from said voltage control oscillator 18 are respectively fed to the phase detector 19 for the phase detection. The detected output voltage representing the phase difference between said two signals is smoothed by the low-pass filter 20 to remove the unnecessary components, and supplied to the voltage control oscillator 18 as the control voltage. In the voltage control oscillator 18, said control voltage is used to control the variable capacitor of the voltage control oscillator. As stated previously, the electrostatic capacity of said variable capacitor is so set that the oscillation frequency f of said voltage control oscillator is equalized to the frequency $f_0$ of the reference signal. In other words, even when the oscillation frequency f is not equal to the frequency $f_0$ of the reference signal due to the dispersion of the value of the resistance of the resistor and the dispersion of the electrostatic capacity of the variable capacitor which respectively affect the oscillation frequency f, these frequencies can be equalized by varying the electrostatic capacity of the variable capacitor, whereby the dispersions of the values of said resistor and said electrostatic capacity by the variable capacitor.

Control voltage output from the low-pass filter 20 is also supplied to oscillator 21, low-pass filter 22 and high-pass filter 23 to control said variable capacitor which determines the oscillation frequency F and cut-off frequencies $f_L$, $f_H$.

In this case, especially when the variable capacitor is used as the control element like the case relating to the present invention, the voltage control oscillator can be operated even at considerably high frequency (Ex. Up to about 20 MHz), and said capacitor is applicable to any kind of filter. Especially, when said variable capacity is applied to the filter, for example, in the case of what is called the single-amplifier-type filter comprising only one amplifier, the practical advantages such as the simple composition of the circuit, small power consumption and low cost can be expected.

On the other hand, the elements incorporated into one IC chip can maintain high specific accuracy respectively, since the degrees of the dispersions of their values are equal in the same direction. Thus, the dispersions of the products of the respective resistances of the resistors and the electrostatic capacities of the variable capacitors which determine the characteristics of voltage control oscillator 18, oscillator 21, low-pass filter 22 and high-pass filter 23 respectively are almost equal. As explained previously, the control voltage output from low-pass filter 20 is used to let the variable capacitor absorb the dispersion of the product of said value of resistance and said electrostatic capacity in voltage control oscillator 18, so that the dispersion of the product of the value of the resistance of the resistor and the electrostatic capacity of the variable capacitor which determines the oscillation frequency F and cut-off frequencies $f_L$ and $f_H$ of each electronic circuit can also be absorbed by controlling the variable capacitors of oscillator 21, low-pass filter 22 and high-pass filter 23 with said control voltage.

Figure 7:
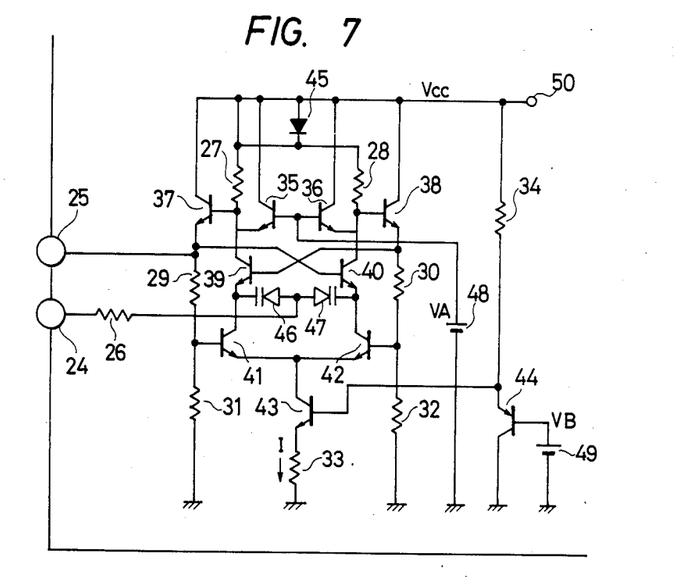
FIG. 7 is the circuit diagram of the oscillator shown in FIG. 5 as an embodiment of the present invention.

FIG. 7 is a circuit diagram of an embodiment of the present invention which, as it is, can be applied to either the voltage control oscillator 18 and as the oscillator 21 shown in FIG. 5. In this diagram, 24 denotes the input terminal, 25 the output terminal, 26 to 34 the resistors, 35 to 44 the transistors, 45 the diode, 46 and 47 the variable capacitors, 48 and 49 the constant voltage sources and 50 the power source terminal.

This embodiment comprises a non-stable multi-vibrator wherein the control voltage from low-pass filter 20 (see FIG. 5) is supplied to input terminal 24 in order to vary the oscillation frequency. Input terminal 24 is connected to the anodes of capacitors 46 and 47 through resistor 26. The cathode of variable capacitor 46 is connected to the emitter of transistor 39, and the cathode of variable capacitor 47 to the emitter of transistor 40. Transistors 35 and 36, 39 and 40, and 41 and 42 respectively constitute the differential pairs. Transistor 43, which is connected to both of the emitters of transistors 41 and 42, and resistor 33 constitute the constant current source of the current I. The power source voltage Vcc is applied to the power source terminal 50. The voltage $V_A$ from constant voltage source 48 is applied to the bases of transistors 35 and 36. The base of transistor 37 is connected to the emitter of transistor 35, and the base of transistor 38 to the emitter of transistor 36. The base of transistor 39 is connected to the emitter of transistor 38, and the base of transistor 40 to the emitter of transistor 37. Resistors 29 and 31 are connected in series to the emitter of transistor 37, and resisters 30 and 32 in series to the emitter of transistor 38. The base of transistor 41 is connected to the connection point of resistors 29 and 31, and the base of transistor 42 to the connection point of resistors 30 and 32. The emitters of transistors 35 and 36 are respectively connected to the cathode of clamping diode 45 through resistors 27 and 28 respectively. The anode of said diode 45 and the collectors of transistors 35 through 38 are respectively connected to power source terminal 50. Output terminal 25 is connected to transistor 37.

The potentials on the sides of the cathodes of variable capacitors 46 and 47 are dependent on the potentials of the emitters of transistors 39 and 40, while the potentials on the anodes of said variable capacitors are dependent on the potential of input terminal 24 which is applied through resistor 26. The value of the resistance of resistor 26 should be large enough so that the impedances on the sides of the anodes of variable capacitors 46 and 47 are large enough. The electrostatic capacities of variable capacitors 46 and 47 should be equal to each other, and these capacities are denoted as $2C_1$ respectively. Thus, the total electrostatic capacity of variable capacitors 46 and 47 connected in series is $C_1$.

In the same figure (FIG. 7), the low-frequency filter can be composed by setting the values of said resistor 26 and electrostatic capacities of variable capacitors 46 and 47 to appropriate values, so that the circuit serving not only as that of said voltage control oscillator 18 but also as that of the low-frequency filter 20 as are shown in FIG. 5 can be composed only with the circuit of the voltage control oscillator having the composition shown in FIG. 7, and as a result, the circuit which is advantageous in terms of the compactness owing to the reduced number of the parts and the reliability can be obtained.

The actions of this embodiment will be explained in the following, using FIG. 8. In this figure, (A), (B), (C) and (D), in this order, denote the emitter potentials of transistors 39, 40, 37 and 38, respectively. The voltages between the bases and the emitters of the transistors 35 through 44 and the forward voltage of diode 45 are denoted as $V_{BE}$, and it is assumed that $Vcc > V_A$.

Figure 8:
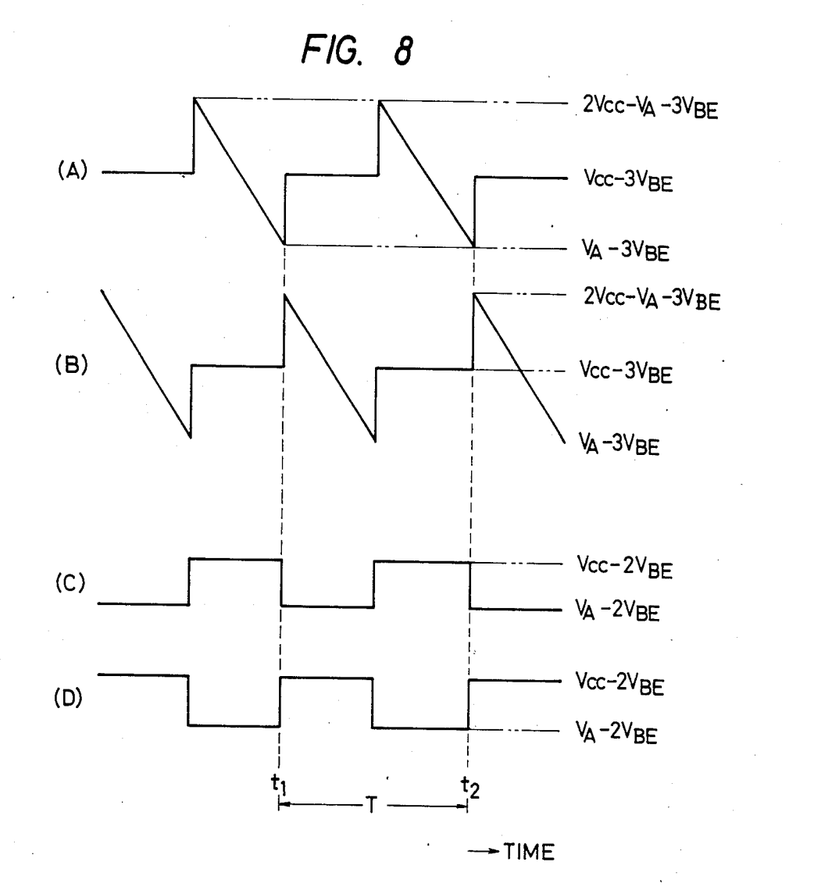
FIG. 8 is a timing chart showing the variations of the potentials of the various parts shown in FIG. 7.

When transistor 39 is on while transistor 40 is off (the time point of the start of this condition is denoted at $t_1$ in FIG. 8), the current flows through diode 45, resistor 27 and transistor 39, so that transistor 35 is on, and the collector potential of transistor 39 is $(V_A - V_{BE})$. On the other hand, the current will not flow through resistor 28, so that the collector potential of transistor 40 is equal to the cathode potential $(Vcc - V_{BE})$ of diode 45, so that transistor 36 is off. The emitter potential ((C) in FIG. 8) of transistor 37 is $(V_A - 2V_{BE})$, and the emitter potential ((D) in FIG. 8) of transistor 38 is $(Vcc - 2V_{BE})$.

In this case, the values of the resistances of resistors 29 and 30 are made equal to those of the resistances of resistors 31 and 32. The emitter potential of transistor 38 is higher than that of transistor 37, so that transistor 41 is off while transistor 42 is on. In this case, the emitter potential ((A) in FIG. 8) of transistor 39 is $(Vcc - 3V_{BE})$ which is lower by $V_{BE}$ than the emitter potential $(Vcc - 2V_{BE})$ of transistor 38.

The emitter current of transistor 39 flows to the constant current source by way of variable capacitors 46 and 47 and transistor 42.

Variable capacitors 46 and 47 are charged by said emitter current, and the emitter potential ((B) in FIG. 8) of transistor 40 decreases gradually at the rate of $I/C_1$ as said charging is made, since the emitter potential ((A) in FIG. 8) of transistor 39 is fixed to $(Vcc - 3V_{BE})$.

When the emitter potential ((B) in FIG. 8) of transistor 40 has become lower than its base potential, or becomes $(V_A - 3V_{BE})$ which is lower by $V_{BE}$ than the emitter potential $(V_A - 2V_{BE})$ ((C) in FIG. 8) of transistor 37, transistor 40 is turned on. This causes the current to flow through resistor 28 to cause transistor 36 to be turned on, and the base potential of transistor 38 becomes $(V_A - V_{BE})$ while the emitter potential ((D) in FIG. 8) becomes $(V_A - 2V_{BE})$. As a result, transistor 39 is turned off, and its collector potential becomes $(V_{cc} - V_{BE})$ to cause transistor 35 to be turned off, while the emitter potential ((C) in FIG. 8) of transistor 37 becomes $(V_{cc} - 2V_{BE})$ rising by $(V_{cc} - V_A)$ from $(V_A - 2V_{BE})$.

Thus, the emitter potentials of transistors 39 and 40 also rise by $(V_{cc} - V_A)$ to become $(2V_{cc} - V_A - 3V_{BE})$ and $(V_{cc} - 3V_{BE})$ respectively. As the result of that the meitter potential ((C) in FIG. 8) of transistor 37 has become higher than the emitter potential ((D) in FIG. 8) of transistor 38, transistor 41 is turned on while transistor 42 is turned off. Consequently, the emitter current of transistor 40 flows into the constant current source through variable capacitors 46 and 47 and transistor 41. This emitter current charges variable capacitors 46 and 47 in the direction which is inverse to the aforementioned case, so that the emitter potential ((B) in FIG. 8) of transistor 40 is maintained at $(V_{cc} - 3V_{BE})$, and the emitter potential ((A) in FIG. 8) decreases at the rate of $I/C_1$. Then, when the emitter potential of transistor 39 has become $(V_A 3V_{BE})$, transistor 39 is turned on while transistor 40 is turned off. This time point is denoted as $t_2$ in FIG. 8.

Figure 4:
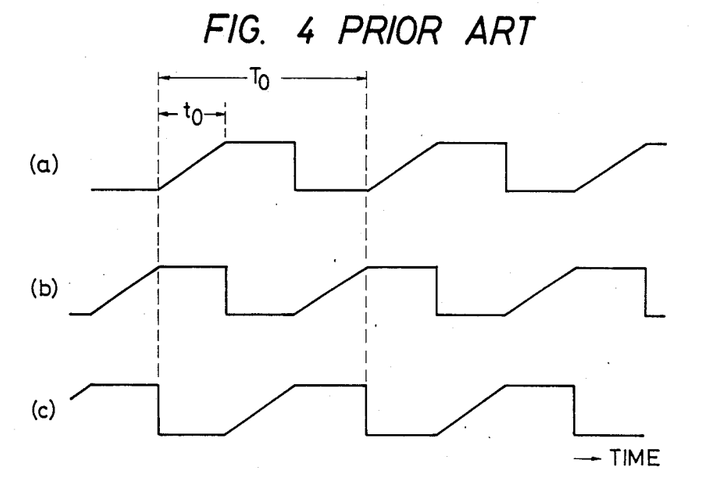
FIG. 4 is a timing chart showing the action of the ring-oscillation type oscillator.

The foregoing actions will constitute a set of actions, and repeated periodically, whereby the pulses having the wave form shown in FIG. 8 (C) can be obtained at output terminal 25.

Where the oscillation period of this oscillator is denoted as T, in FIG. 4 (A) and (B), the period of the initial T/2 is equal to the period through which the emitter potential of transistor 40 varies from $(2V_{cc} - V_A - 3V_{BE})$ to $(V_A - 3V_{BE})$ by $2(V_{cc} - V_A)$ at the rate of $I/C_1$, and the same can be said as to the period of the second T/2, as to transistor 39, so that T/2 can be expressed as $$T/2 = 2C_1(V_{cc} - V_A)/I \tag{8}$$

Therefore, the oscillation frequency f can be given as $$f = 1/T = 1/(4C_1(V_{cc} - V_A)) \tag{9}$$

On the other hand, the emitter voltage of the PNP type transistor 44 is applied to the base of transistor 43 which constitutes the constant current source. Where the voltage of the constant voltage source applied to the base of said transistor 44 is given as $V_B$, the emitter potential of transistor 43 is $V_B$, since the base-emitter voltages of transistors 43 and 49 are equally $V_{BE}$. Thus, where the resistance of the resistor 33 is given as $R_1$, the current I (Current for charging variable capacitors 46 and 47) of said constant current source can be expressed as $$I = V_B/R_1 \tag{10}$$

From Eqs. (9) and (10), the oscillation frequency f can be given as $$f = V_B/4C_1R_1(V_{cc} - V_A) \tag{11}$$

In Eq. (11), $V_B$ and $(V_{cc} - V_A)$ are constant, and so the oscillation frequency f is the function of $C_1R_1$ only. Therefore, when the voltage applied to the variable capacitors 46 and 47 from input terminal 24 varies, the oscillation frequency f also varies, whereby the oscillation frequency can be controlled by the control voltage.

Figure 9:
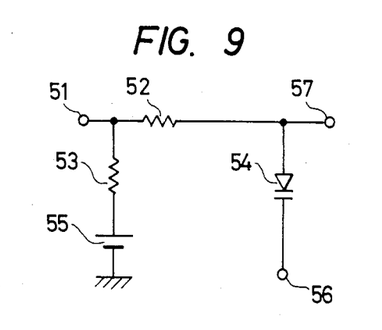
FIG. 9 is the circuit diagram of the low-pass filter whose characteristic is controllable shown in FIG. 5 as an embodiment of the present invention.

FIG. 9 is a circuit diagram of an embodiment of the present invention concerning the low-pass filter 22 shown in FIG. 5, wherein 51 denotes the signal input terminal, 52 and 53 the resistors, 54 the variable capacitor, 55 the constant voltage source, 56 the control voltage application terminal and 57 signal output terminal.

In this embodiment, the primary low-pass filter is composed of resistor 52 and variable capacitor 54. Where the resistance of resistor 52 is given as $R_2$ and the electrostatic capacity of variable capacitor 54 as $C_2$, the cut-off frequency $f_L$ can be expressed as $$f_L = 1/2\pi C_2 R_2 \tag{12}$$

The DC voltage is applied to the anode the variable capacitor 54 from constant voltage source 55 through resistors 53 and 52. The electrostatic capacity $C_2$ of variable capacitor 54 can be varied by applying the control voltage output from low-pass filter 20 shown in FIG. 5 to the cathode of variable capacitor 54 through the control voltage application terminal 56.

Also, the inverse application voltages of variable capacitors 46 and 47 shown in FIG. 7 can be made equal to the inverse application voltage of variable capacitor 54 shown in FIG. 9 by setting the voltage of constant voltage source 55 equal to the mean value $(V_{cc} - 3V_{BE})$ of the emitter potentials ((A) and (B) in FIG. 8) of transistors 39 and 40, and by making the control voltage to be applied to control voltage application terminal 56 equal to the control voltage to be applied to the control voltage application terminal 24 shown in FIG. 7.

Figure 10:
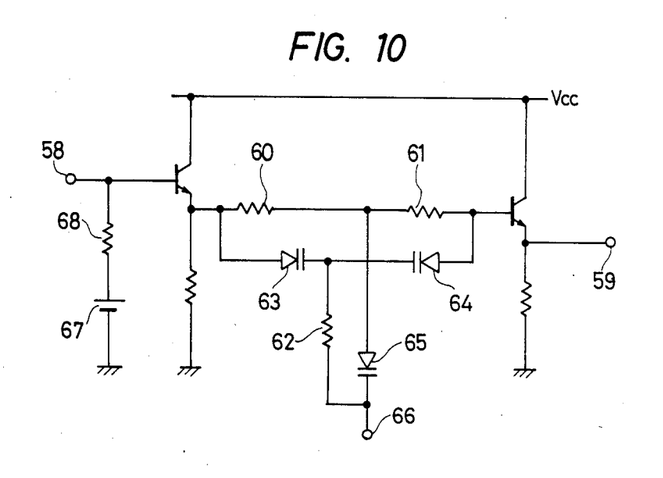
FIG. 10 is the circuit diagram of the filter whose characteristic is controllable as an embodiment of the present invention.

FIG. 10 is the circuit diagram of the filter whose characteristic is controllable as another embodiment of the present invention, wherein 58 denotes the signal input terminal, 59 the signal ouput terminal, 60 through 62 the resistors, 63 through 65 the variable diodes, 66 the control voltage application terminal, 67 the constant voltage source and 68 the resistor.

This embodiment is the twin-T type trap filter applicable to the circuit defined by the present invention. Where the resistances of resistors 60 and 61 are given as $R_3$, the resistance of resistor 62 as $2.R_3$ the electrostatic capacities of variable capacitors 63 and 64 as $C_3$ and the electrostatic capacity of variable capacitor 65 as $C_3/2$, the trap frequency fr can be expressed as $$fr = 1/2\pi R_3 C_3 \tag{13}$$

Said capacity $C_3$ is varied by the control voltage applied from control voltage application terminal 66, whereby the trap frequency fr can be made variable.

Figure 11:
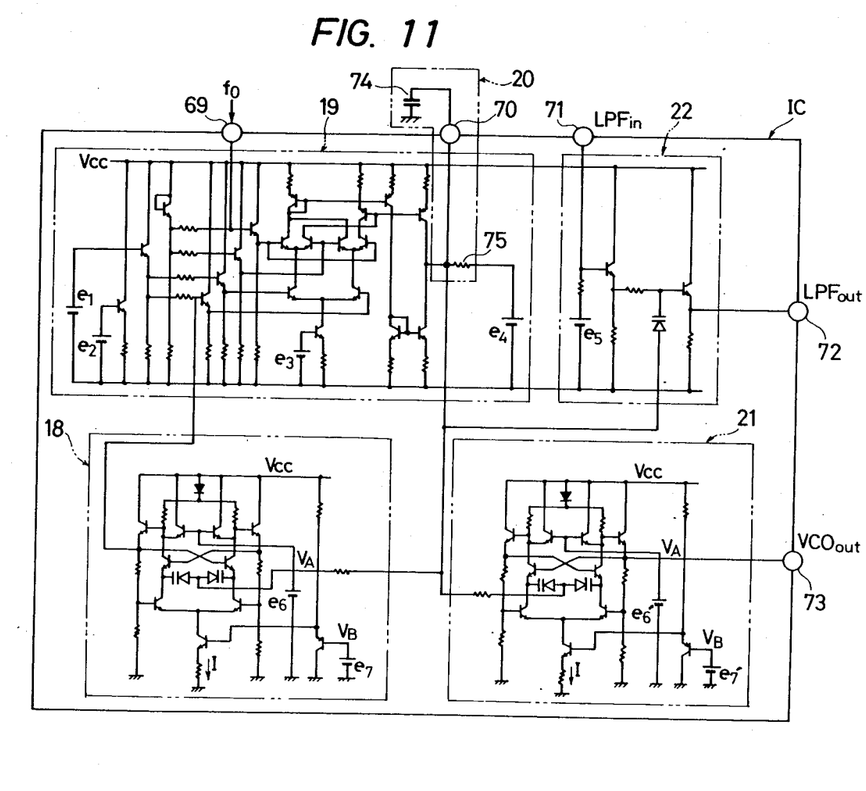
FIG. 11 shows the details of the integrated circuit shown in FIG. 5 comprising the oscillator shown in FIG. 7 and the low-pass filter shown in FIG. 9.

FIG. 11 is an actual circuit diagrams of the oscillator shown in FIG. 7 and the low-pass filter shown in FIG. 5 applied to the embodiment shown in FIG. 5, wherein 69 through 73 denotes the IC pins, 74 the external capacitor, 75 the resistor and $e_1$ through $e_7$ the constant voltage source, and the common symbols are used for the corresponding parts.

In FIG. 11, voltage control oscillator 18 and oscillator 21 have the composition as is shown in FIG. 7. For the low-pass filter 22, the primary low-pass filter having the composition as is shown in FIG. 9 is used. The reference signal of the reference oscillator 16 (FIG. 5) is supplied to phase detector 19 from IC pin 69. Phase detector 19 is a generally known multiplier type detector. Low-pass filter 20 consists of external capacitor 74, which is externally connected to IC pin 70, and resistor 75 incorporated into the IC. The oscillation frequency of oscillator 21 differs from the oscillation frequency of voltage control oscillator 18, and the output signal of said oscillator 21 can be obtained from IC pin 73. The input signal of low-pass filter 22 is supplied from IC pin 71, and the corresponding output signal can be obtained from IC pin 72. The control voltage which can be obtained from low-pass filter 20 is supplied to the variable capacitors of voltage control oscillator 18, oscillator 21 and low-pass filter 22 respectively, and, as explained previously, the dispersions of characteristics are absorbed as the electrostatic capacities of said variable capacitors vary respectively.

Figure 12:
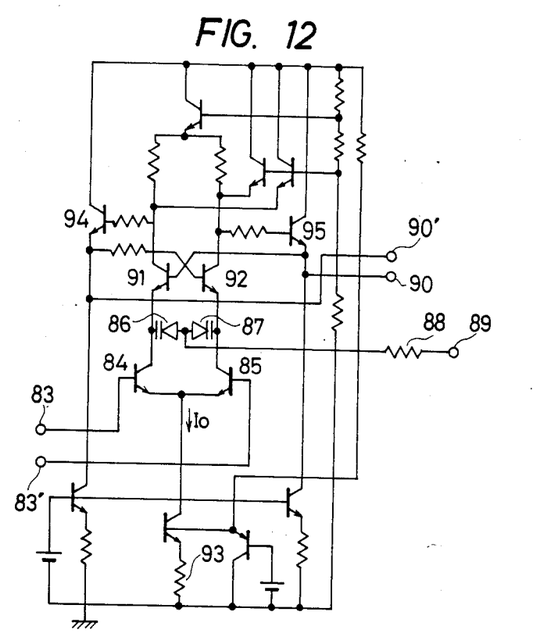
FIG. 12 is a circuit diagram showing the delay circuit as an embodiment of the present invention.

FIG. 12 is an embodiment of the present invention applied to the delay circuit, especially to the delay circuit used as a component of the FM demodulator. What is to be noted as the delay circuit shown in FIG. 12 is that the variable capacitors are used for capacities 86 and 87.

The potentials on the sides of respective anodes are dependent on the potentials of transistors 91 and 92, whereas the potentials on the sides of the cathodes are dependent on the potential of the non-adjustment signal input terminal 89 connected through resistor 88. Therefore, the voltage applied to the variable capacitor is varied by the potential of input terminal 89, and the values of capacities 86 and 87 vary accordingly. The actions (of the circuit) will be explained in the following. In this explanation, the series capacity of variable capacitors 86 and 87 is denoted as C.

Figure 13:
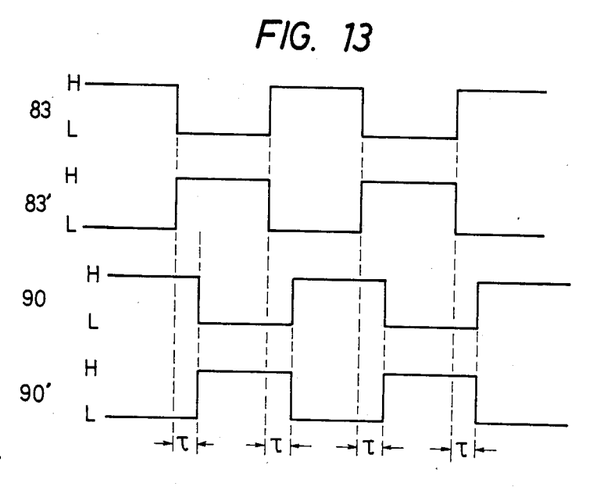
FIG. 13 shows the respective wave forms of the input terminal and the output terminal of the circuit shown in FIG. 12.

FIG. 13 shows the wave forms at input terminals 83 and 83' and output terminals 90 and 90'. Said delay circuit basically consists of the multi-vibrator, wherein the FM signals A and B ouput from the limiter (not shown in the drawing) differing by 180° in phase from each other are supplied to the bases of transistors 84 and 85 which are caused to make the switching action respectively by input terminals 83 and 83'. Transistors 84 and 85 are turned on and off alternatingly, whereby the direction of the charge of series capacity C of variable capacitors 86 and 87 connected between the collectors transistors 84 and 85 is changed.

When transistor 84 is turned on at a high level (hereinafter referred to as "H") of FM signal A, transistor 85 is off, and variable capacitors 86 and 87 having said series capacity C are charged with the current which flows from the collector of transistor 85 to the collector of transistor 84. When said charging voltage has reached a predetermined voltage by rising gradually, transistor 91 which has been off will be turned on, whereas transistor 92 which has been on will be turned off. Thus, the level "L" of output terminal 90 is reversed to "H", and simultaneously the level "H" of output terminal 90' is reversed to "L".

The capacitors (Capacity C) are charged in the aforementioned manner, so that the timing at which the levels of output terminals 90 and 90' are reversed in the aforementioned manner will delay by time $\tau$ from the timing at which the level "L" of FM signal A from input terminal 83 is reversed to "H".

When the level "L" of FM signal B from input terminal 83' is reversed to "H", transistor 85 is turned on while transistor 84 is turned off, so that the capacitors (Capacity C) will be charged with the current which flows from the collector of transistor 84 to the collector of transistor 85, and similarly to the aforementioned case, the level "H" of output terminal 90 is reversed to "L", whereas the level "L" output terminal 90' is reversed to "H" simultaneously.

The timing at which the levels of output terminals 90 and 90' are reversed in the manner described above delays by aforementioned time $\tau$ from the timing at which the levels of FM signals A and B are reversed. From the foregoing, at output terminal 90, FM signal A' which is delayed by time $\tau$ from FM signal A can be obtained, while at output terminal 90', FM signal B' which is delayed by time $\tau$ from FM signal B can be obtained. Said delay time $\tau$ is in proportion to the electrostatic capacity C of the capacitor, and in inverse proportion to the value of the current Io of the constant current source connected to the emitters of transistors 84 and 85. In other words, said delay time $\tau$ can be expressed as $$\tau \alpha (C/Io) \tag{14}$$

Where resistance of resistor 93 is given as R, we obtain $$Io = E/R \tag{15}$$

Therefore, $$\tau = K_5 CR \tag{16}$$

where $K_5$ is constant, and $\tau$ becomes the function of the product of C and R only. Therefore, the dispersions of C and R can be absorbed by applying the non-adjustment control signal to terminal 89.

In the foregoing, the preferred embodiments of the present invention are explained respectively. It should be noted, however, that the present invention relating to the electronic circuit controlled by the control voltage is not only applicable to the oscillators and the low-pass filters having aforementioned compositions but also applicable to oscillators and low-pass filters having characteristics which are dependent on the product of the resistance value of the reistor and the electrostatic capacity of the capacitor, and the compositions different from the aforementioned compositions, and further to other electronic circuits such as those of high-pass filters and band-pass filters too.

As explained in the foregoing, the present invention enables the dispersions of the values of the capacitors and the resistors to be absorbed automatically, so that the electronic circuits of the oscillators and the resistors not requiring adjustment from outside can be incorporated into the IC, whereby not only the reduction of the number of the parts through the elimination of the parts needed for the adjustment, and the reduction of the dimensions and the weight can be realized but also the improvement in the productivity and the yield rate in manufacturing such electronic circuits can be realized. Furthermore, the present invention enables the IC element to be freed from its dependency on the temperature, since the present invention enables the automatic absorption of the change in the value of the IC element due to the change in the temperature, so that the present invention enables the low-cost production of high-quality integrated circuits which are free from the aforementioned shortcomings of the integrated circuits manufactured by the conventional manufacturing method.

What is claimed is:

1. An integrated circuit provided with a resistor element and a capacitor element which are installed on a common substrate and at least one electronic circuit with a respective characteristic which is dependent on the product of a resistance value of said resistor element and an electrostatic capacity of said capacitor element, comprising:

a voltage control oscillator installed on said substrate whose oscillation frequency is dependent on the product of the resistance value of said resistor element and the electrostatic capacity of said capacitor element, wherein said capacitor element is a variable capacitor;

means for comparison of a predetermined frequency of a reference signal with the output signal frequency from said voltage control oscillator;

a filter to remove unnecessary components from the output of said comparison means;

means for control of said variable capacitor of said voltage control oscillator by a control voltage supplied from said filter in order to make the oscillation frequency of said voltage control oscillator agree with the frequency of said reference signal; and means for control of said variable capacitor of said electronic circuit by the control voltage supplied from said filter.

2. An integrated circuit according to claim 1, wherein said means for comparison of a predetermined frequency of a reference signal with the output signal frequency from said voltage control oscillator comprises a phase detector which is capable of phase-detecting said reference signal by its phase, using the output signal from said voltage control oscillator.

3. An integrated circuit according to claim 1, wherein said voltage control osillator is comprised of the resistor element and the variable capacitor connected to said resistor element, and said resistor element and said variable capacitor are designed so as to be also used as at least a part of said filter.

4. An integrated circuit according to claim 1, wherein said filter is a low-pass filter.

* * * * *